(12) United States Patent
Joshi

(10) Patent No.: US 7,783,995 B2
(45) Date of Patent: Aug. 24, 2010

(54) SYSTEM AND METHOD FOR CIRCUIT DESIGN SCALING

(75) Inventor: Rajiv V. Joshi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 677 days.

(21) Appl. No.: 11/683,539

(22) Filed: Mar. 8, 2007

(65) Prior Publication Data

US 2008/0222578 A1    Sep. 11, 2008

(51) Int. Cl.
*G06F 17/50* (2006.01)
(52) U.S. Cl. .............................................. 716/1; 716/3
(58) Field of Classification Search ...................... 716/1, 716/3
See application file for complete search history.

(56) References Cited

U.S. PATENT DOCUMENTS

| 5,920,486 | A | 7/1999 | Beahm et al. | |
|---|---|---|---|---|
| 7,363,601 | B2 * | 4/2008 | Heng et al. | 716/3 |
| 2003/0147187 | A1 * | 8/2003 | Voldman | 361/56 |
| 2005/0081167 | A1 * | 4/2005 | Kever et al. | 716/2 |
| 2005/0102644 | A1 * | 5/2005 | Collins et al. | 716/11 |
| 2005/0125748 | A1 | 6/2005 | Gray et al. | |
| 2005/0289485 | A1 | 12/2005 | Willis | |
| 2006/0085768 | A1 * | 4/2006 | Heng et al. | 716/2 |
| 2006/0101358 | A1 | 5/2006 | Shah et al. | |
| 2006/0289861 | A1 * | 12/2006 | Correale, Jr. | 257/48 |
| 2008/0148210 | A1 * | 6/2008 | Heng et al. | 716/10 |

* cited by examiner

*Primary Examiner*—Jack Chiang
*Assistant Examiner*—Suchin Parihar
(74) *Attorney, Agent, or Firm*—Tutunjian & Bitetto, P.; Brian Verminski, Esq.

(57) ABSTRACT

A system and method for scaling a circuit design to a new technology includes designating a first set of components including design scaled elements having a designed scaling in two dimensions to render the first set of components inactive for scaling of a second set of components. The second set of components includes pitch-matched circuits. The second set of components is scaled. Then, the second set of components is designated to render the second set of components inactive for scaling of the first set of components. The first set of components is scaled in accordance with a plurality of scale factors including scaling the design scaled elements in accordance with reference scale factors and scaling other components in the first set of components in accordance with one of the reference scale factors.

35 Claims, 6 Drawing Sheets

SYSTEM AND METHOD FOR CIRCUIT DESIGN SCALING

BACKGROUND

1. Technical Field

The present invention relates to circuit design and more particularly to systems and methods for scaling integrated circuits to accommodate different technologies and components.

2. Description of the Related Art

Many applications are improved through the use of integrated circuits. Integrated circuits provide a compact, reliable and cost effective way of implementing circuitry in many different systems. With the advance of technology, integrated circuits are often scaled to permit the use of an old circuit design with the new technology. There are many problems that result from scaling circuitry.

One particularly difficult instance includes the scaling of a static random access memory (SRAM). Referring to FIG. 1, an illustrative circuit 10 includes an SRAM cell 12, a word decoder 14 and a bit select circuit 16, In SRAM circuit layouts, size or scaling of the circuit in the x-direction is different then the scaling in the y-direction. The difference in x and y scale factors is to achieve gains in performance and stability of the circuits.

The SRAM cell 12 has a greater impact on the x-direction pitch and therefore has a large influence on the x-direction pitch for the bit select circuit 16 and back-end wiring. The word decoder 14 is substantially influenced by the y-direction pitch. The word decoder 14 (and peripheral logic) scale with respect to the technology permitted by a polysilicon grid (e.g., a minimum feature size of the semiconductor processing technology). The poly grid refers to the polysilicon typically formed in lines or grids being spaced in accordance with a minimum feature size for gates which in effect determines the transistor size. The poly grid usually determines the correct spacings for source and drain implant regions and therefore the spacings of transistors.

The x-pitch of the bit select circuitry 16 and back end wiring scale with respect to migration rules. Migration rules are ground rules that govern aspects of the chip layout and permit different or optimal positioning of circuits or components. FIG. 1 depicts conventional circuitry including bitlines (blc and blt), word line W1, bit select circuits (Bit sel0 through Bit seln), a dominion read circuit 17, output latches 19 and a word line driver 15. The bit select circuit 16 includes inputs from a bit driver, read/write driver, data driver and a reset driver.

Since the x and y directions are influenced by different factors, the SRAM cell 12 becomes extremely difficult to scale. The SRAM cell 12 does not easily scale in accordance with both the x and y scalings especially between different technology types (e.g., one generation of a chip design to the next). Current, manipulation tools prove inadequate at addressing the problems of scalability for circuits like the SRAM cell 12, One such tool includes a migration assistant shapes handler (MASH).

Referring to FIG. 2, a basic process flow for a MASH system is illustratively depicted. A design 50 with complicated shapes is input. The shapes may represent portions of a circuit such as gates, contacts, metal lines, etc. In block 52, a sophisticated shapes preprocessor processes the locations, shapes, sizes, etc. of the shapes in the design to permit a workable layout 51. This information is input to an optimization engine 52 along with ground rules and controls from a module 54. Engine 52 checks the shape layout against the ground rules and other criteria to ensure that no rules or constraints are violated. Then, the layout optimization engine 52 (e.g., EMMA), is employed to optimize the sizes and locations of the shapes in accordance with the ground rules and controls. During the optimization, ground rule errors are corrected or variances granted to provide a desired/optimized layout 56.

The MASH tool may employ parameterized cells (P cells). P-cells at device and gate levels of a design do not permit the ability for wire migration especially at upper levels of a design. P-cells may permit the generation of custom or semi-custom layouts at the device or gate level. By specifying the width and length of a device, and/or other device options, the P-cells can automatically be placed and routed based on the connectivity of the devices in the layout. The MASH system does not maintain the integrity of the P-cells and does not scale custom SRAM arrays. In addition, for back end wiring, especially at higher levels in the design, scaling is difficult.

SUMMARY

A system and method for scaling a circuit design to a new technology includes designating a first set of components including design scaled elements having a designed scaling in two dimensions to render the first set of components inactive for scaling of a second set of components. The second set of components includes pitch-matched circuits. The second set of components is scaled. Then, the second set of components is designated to render the second set of components inactive for scaling of the first set of components. The first set of components is scaled in accordance with a plurality of scale factors including scaling the design scaled elements in accordance with reference scale factors and scaling other components in the first set of components in accordance with one of the reference scale factors.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
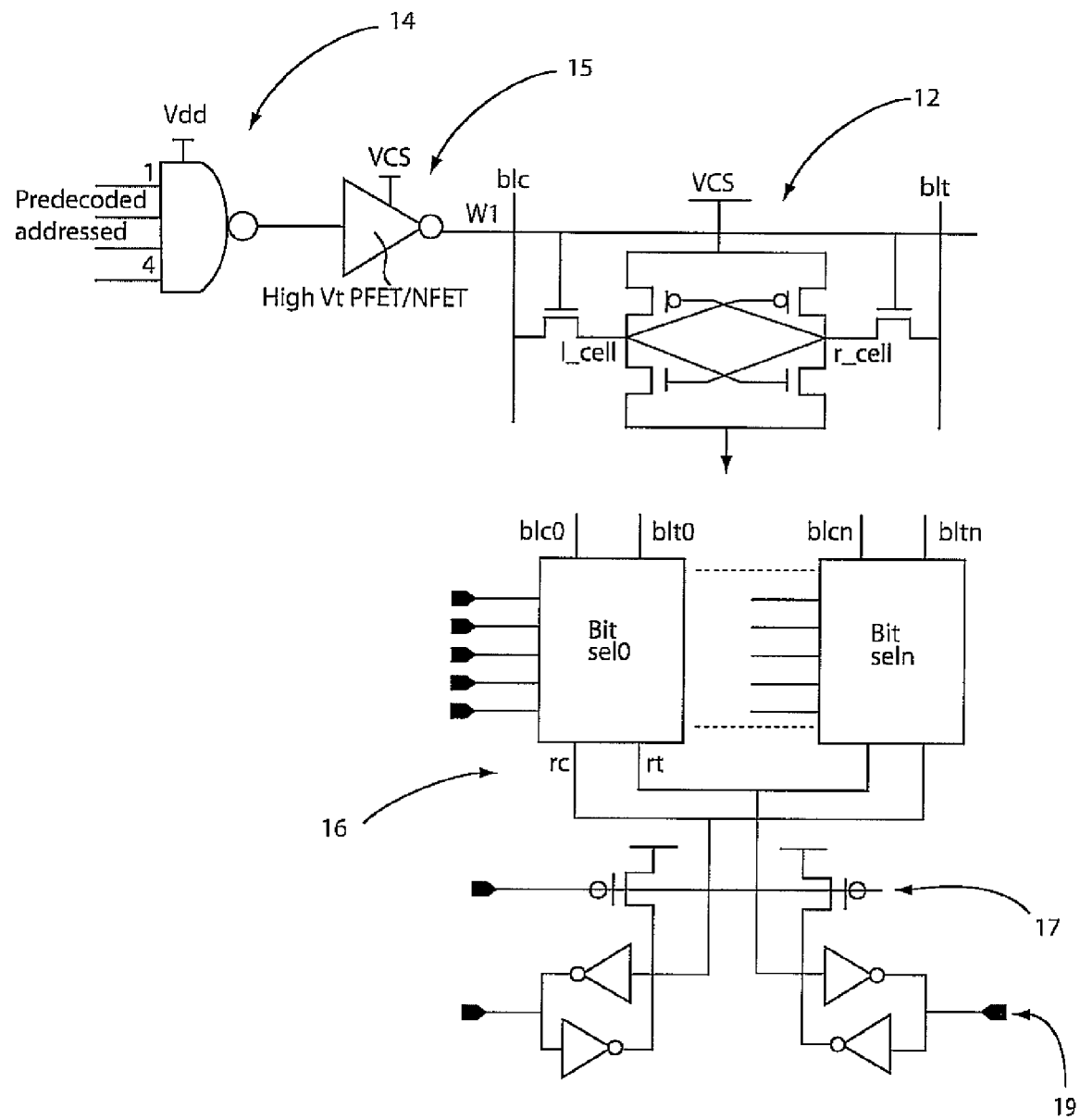
FIG. 1 is a schematic diagram of an illustrative SRAM circuit in accordance with the prior art.
Figure 2:
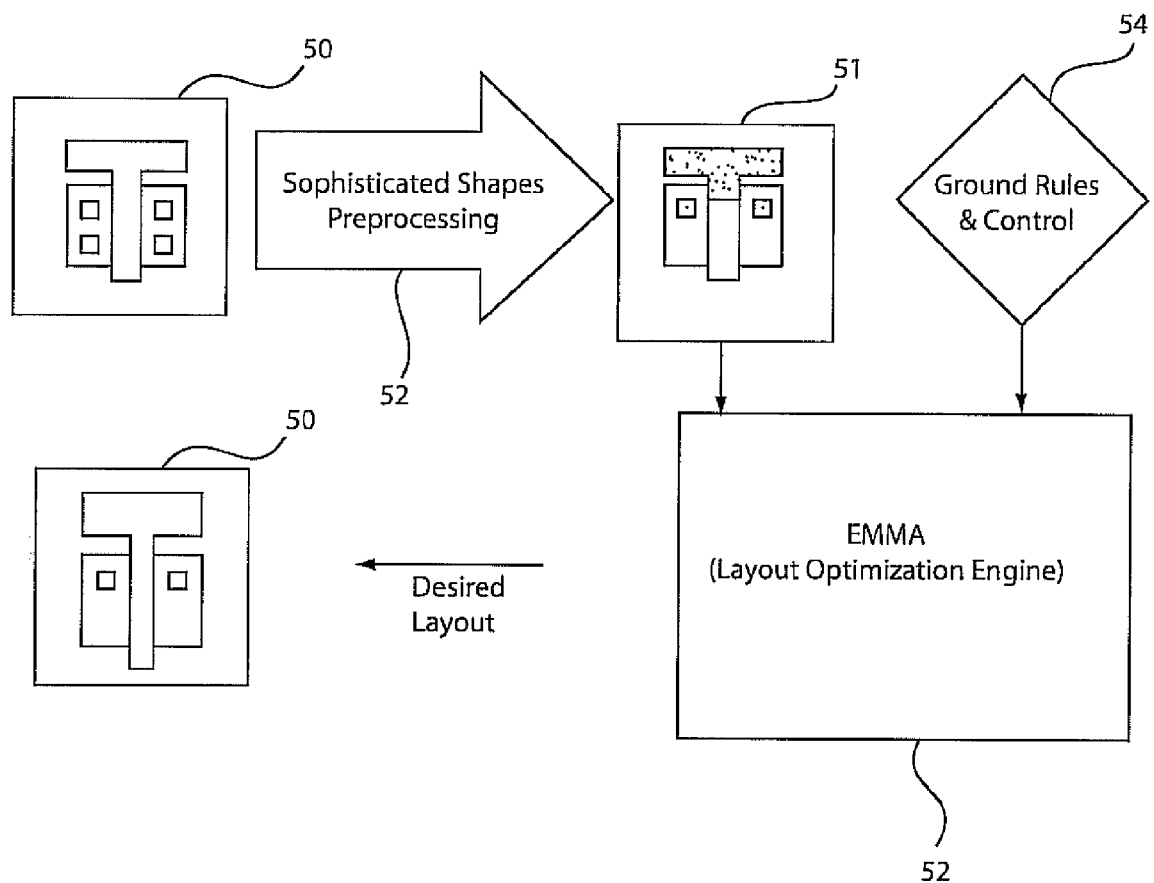
FIG. 2 is a flow diagram showing a migration assistant shapes handler in accordance with the prior art.

Present embodiments address issues in scaling integrated circuit designs. The present embodiments are particularly useful where a specific circuit affects the scaling in one direction differently than the scaling in a second direction. The following description employs a static random access memory (SRAM) circuit as an example to demonstrate aspects in accordance with the present principles. However, it should be understood that the present embodiments are directed to any circuit where scaling is an issue or creates issues. For example, applications may be employed for processors, application specific integrated circuits (ASICs), memory cells or devices (e.g., SRAM, EDRAM), multiport cells and other designs or devices.

Embodiments of the present invention can take the form of an entirely hardware embodiment, an entirely software embodiment or an embodiment including both hardware and software elements. In a preferred embodiment, the present invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that may include, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), dynamic Random access memory (DRAM), a read-only memory (ROM), a rigid magnetic disk and an optical disk. Current examples of optical disks include compact disk—read only memory (CD-ROM), compact disk—read/write (CD-R/W) and DVD.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modems and Ethernet cards are just a few of the currently available types of network adapters.

The methods as described herein may be part of the process for designing an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., Graphic Data System II (GD-SII)) for the fabrication of photolithographic masks, which typically include multiple copies of the chip design in question that are to be formed on a wafer. The photolithographic masks are utilized to define areas of the wafer (and/or the layers thereon) to be etched or otherwise processed. The methods as described herein are preferably used in the design and fabrication of integrated circuit chips.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 3:
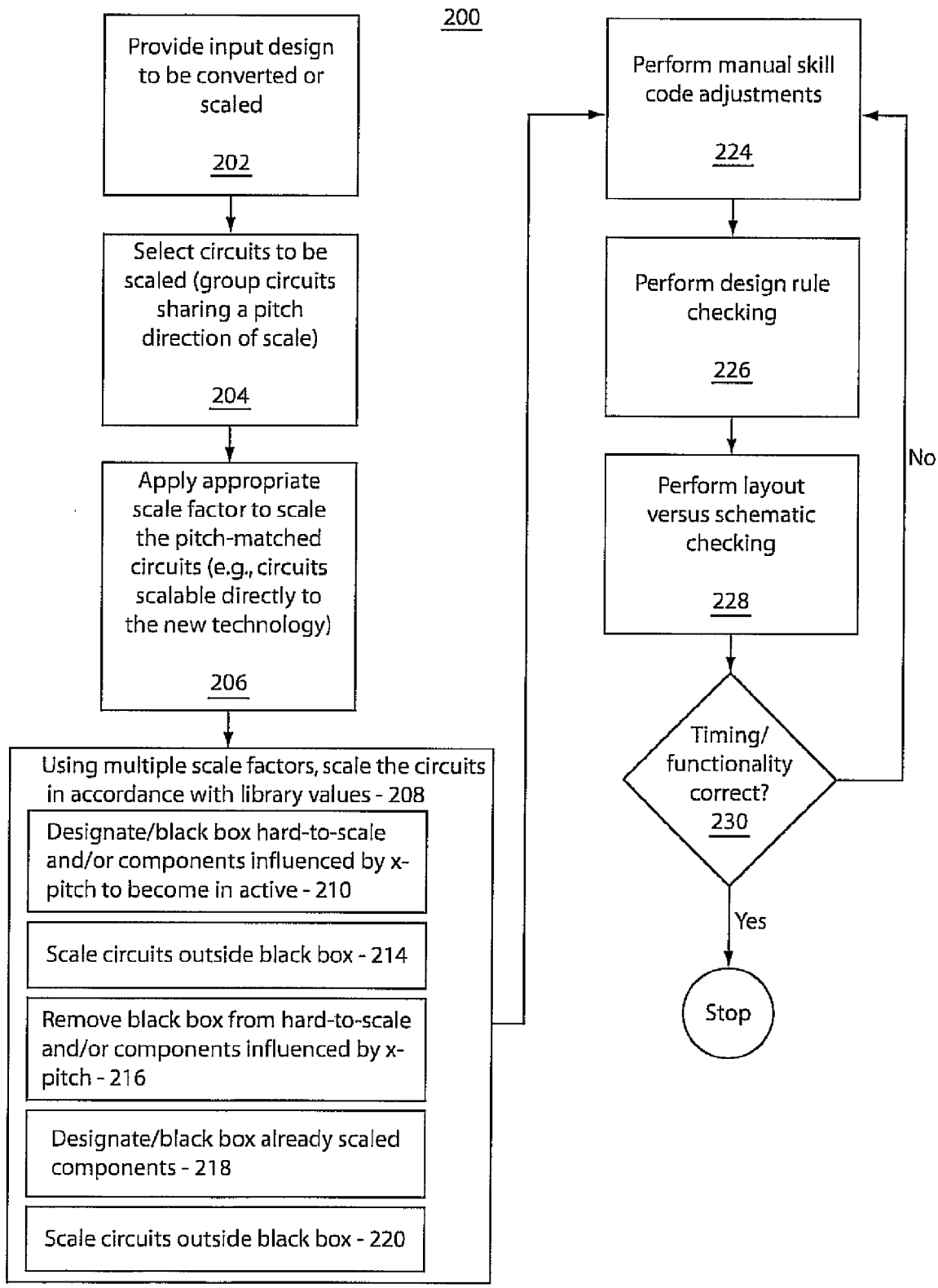
FIG. 3 is block/flow diagram of a system/method for converting or scaling a design or layout to a new technology in accordance with the present principles.

Referring now to the drawings in which like numerals represent the same or similar elements and initially to FIG. 3, a system/method 200 for providing multiple scale factors for scaling components and circuits in a layout is illustratively shown in accordance with one embodiment. The system/method 200 is employed in scaling from a first technology to a new technology. In other words, an existing design in an old technology is converted to a new technology (e.g., a different and usually smaller minimum feature size although other sizes are contemplated as well). The input in block 202 may include a net list or other formatted listing of components and/or circuits and their positions in a layout (e.g., the old layout). The listing may be in or converted to a standard format, such as, a Graphic Data System (GDS) or gl1 format.

This system works using a top-down and a bottom-up approach as will become apparent from the following description. In block 204, a selection is made of hierarchical circuits to be scaled. Sizing of components at this level may be based on a y-pitch used for circuits that are more influenced by the y-pitch, e.g., word decoders, drivers, receivers, poly grid and wired based hierarchies, and an x-pitch may be used in placement and sizing of circuits or components more influenced by the x-pitch, e.g., bit select circuits, output latches, etc. The circuits in the hierarchy may be selected based on the ease of scaling. This may create two or more sets of elements to be scaled, e.g. in this illustrative case, scaling will depend on SRAM cell dimensions in x and y directions.

In block 206, the appropriate scale factor is applied to the easily scaled pitch-matched circuits, and when appropriate such circuits and components are directly scaled to the new technology. For example, the circuits that match the pitch size in the y direction and/or the x direction are placed in the new layout with the new pitch. This may be performed using a MASH system or by programming skill code to execute the transition from one technology to another. For illustrative purposes, a scale factor of, e.g., 1 may be applied to the y-pitch elements (elements influenced more by the y-pitch or minimum feature size of the layout), and a scale factor of 2 may be applied to the elements influenced more by the x-pitch (or effected more by the migration rules of the layout). The pitch-match circuits are those that are easily scaled to the new technology. In this example, two scale factors are described, however, it is to be understood that the same principles can be used to scale in multiple directions, e.g., at angles, in the z-direction, etc. In addition, because of the flexibility provided, the present principles permit multiple scale factors to be employed simultaneously.

By way of background, the physical design (PD) or layout may be expressed in a net list that may have been generated by first producing a logic level description of a desired VLSI circuit, the description may comprise a series of logic statements describing the function to be implemented by the circuit. This logic level description can then be synthesized into a logic gate circuit diagram. Libraries or library entries corresponding to each of the gates in the circuit would then be called. However, it is the net list for the logic circuit which is provided as the input in block 202. A programmable library book (PLB) set is generated. This set can include, for instance, inverters, NOR gates, NAND gates or other complex gates. The PLB set is a set of layouts for each of the logic gates that appear in the logic net list. These layouts can either be computed all at once, meaning all layouts for all logic gates in the library can be computed at the beginning, or the layout can be computed for each gate as it is encountered in computing layouts for the layout circuit or schematic.

A technology file or techfile is provided. The tech file includes ground rules and layer information for the technology being used. Also, provided as part of the technology file are design rule checks. The user can provide inputs for desired row height, area, VDD, and ground for the circuit under consideration.

A programmable library book is generated by referring to a library file which includes schematic representations for the various gates that may appear in the input gate net list. One option is to generate a hard coded layout library for each power level (or hierarchy) for each device or gate. A second option is to generate a library on the fly, that is, generate the layout for a particular power level (or hierarchy) for the gate as needed and based on the delay and timing information of the gates in the net list. Schematics, symbols, layout and abstracts may all be generated.

Auto placement is then performed in the new layout. The layout for the schematic is output. In this layout step, unwanted shapes are eliminated and layouts merged together where appropriate. The size of all structures can be variable depending on the design, technology and other requirements. If the device size becomes too large, it can be split into many fingers. The fingers help to reduce the resistance of the poly gate wire and lower the diffusion capacitance. These concepts are described in the commonly assigned, U.S. Pat. No. 5,920,486, incorporated herein by reference.

In block 208, circuits and elemental cells (or leaf cells) in the hierarchy that are defined in libraries (e.g., array or array built in self test (ABIST) common libraries) are converted to the new technology. In accordance with the present principles, this is performed using multiple scale factors to convert the elemental cells to the new technology. For example, a level 1 leaf cell may need a first scaling factor while a level 2 leaf cell may need a same or different scale factor. In accordance with the present embodiments, all of these scale factors can be employed concurrently. This permits the scaling of device widths, or lengths to fit in the desired layout even though they are not in pitch-match circuits. For example, elemental cells are converted to the new technology using a scale factor that permits the cells to fit within the layout of the area of the next highest level in the hierarchy. This will impact the scale factor to permit the cells to fit. Some of the cells and some of the components will not scale appropriately. These scale factors need to be adjusted. This can be performed by a black boxing technique or by appropriate skill code programming. Using skill code programming a routine that follows the method steps described herein may be employed. In such a case, the actual black boxing would not be needed since the circuit components can be appropriately flagged or designated for enabling or disabling scaling of these components.

In block 210, the cells or components that are hard-to-scale or are more influenced by x-pitch (referred to as a first set) are designated and placed in a black box (or otherwise designated, e.g., in code) to prevent these components from being scaled in the next step. All cells outside of the first set are then scaled to the new technology in block 214. This scaling may include y-pitch influenced circuits, such as word decoders, drivers, latches, etc. Next, in block 216, the black box is removed from the hard-to-scale and x-pitch influenced circuits. Now, the already scaled circuits are black boxed in block 218. The x-pitched circuits are now scaled to the new technology, and a designed scaling of the hard-to-scale features is also performed in block 222. For example, an SRAM cell may be referenced in the new library to determine the new scaling factors for the new technology. The hard-to-scale components are then scaled in accordance with the referenced or designed scaling stored in a library.

In block 224, the new layout is further adjusted to fix device fingers, widths, beta ratios, unscaled pitches, etc. This may be performed manually by checking the design or by adjusting the skill code that defines the layout. Device fingers are employed in a design if a device size becomes too large. The device can be split into many fingers. The fingers help to reduce, e.g., the resistance of a poly gate wire and lower diffusion capacitance. In block 226, design rule checking is performed by a design rule checker (DRC). In block 228, a layout versus schematic (LVS) is performed to determine wire widths that need may need to be adjusted. Blocks 224, 226 and 228 may be performed manually.

In block 230, timing and functionality checks are performed to determine if the new layout meets the requirements for timing and function. If not the process returns to block 224, otherwise the process ends. The process 200 may be repeated as needed. This may include rerunning these steps or some of these steps after different tools have been used to ensure design rule violations have been removed. It should be noted that the black-boxing is optional and are preferably employed when manual (user performed) scaling is provided.

Figure 4:
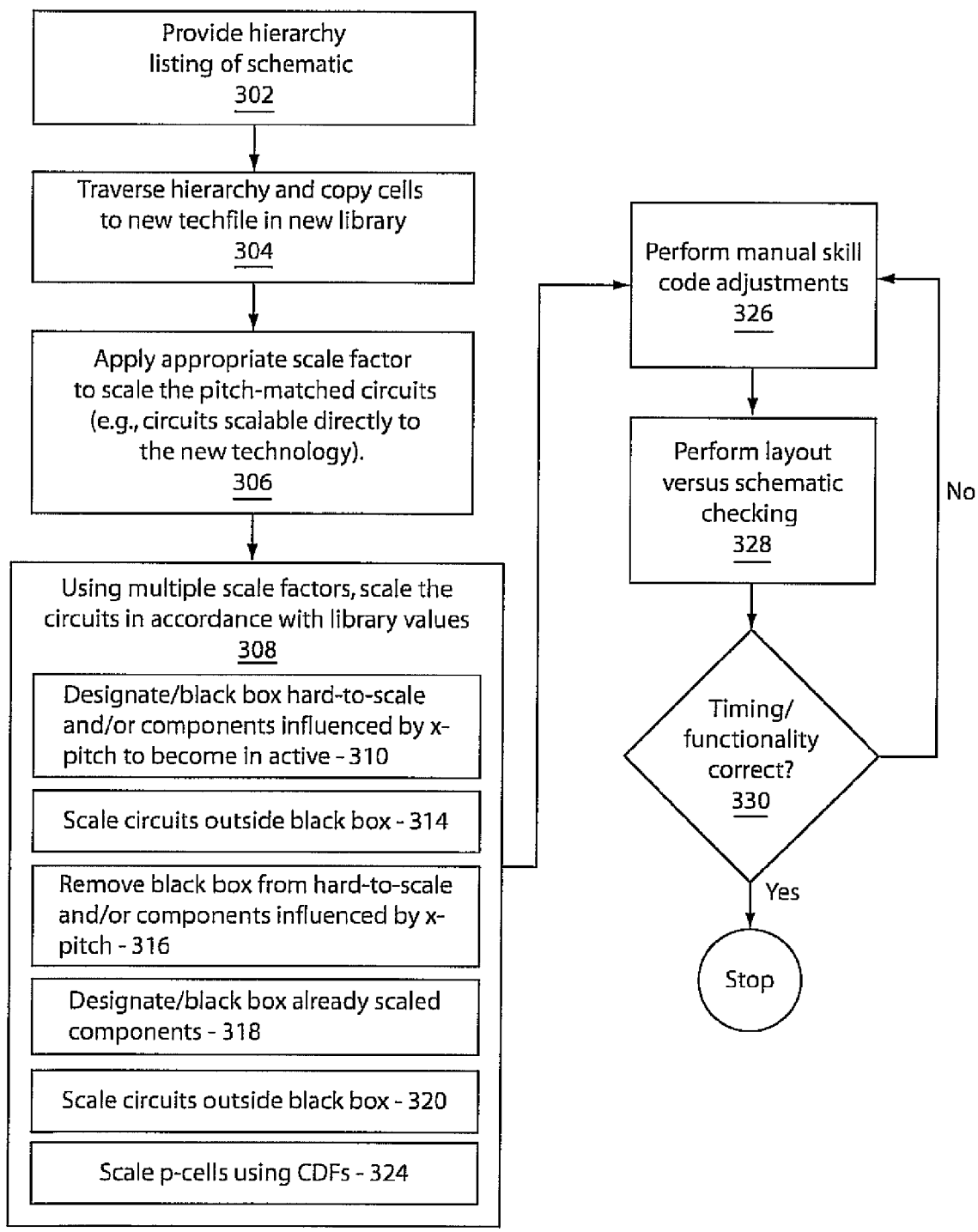
FIG. 4 is block/flow diagram of a system/method for converting or scaling a design or layout in schematic form to a new technology in accordance with the present principles.

Referring to FIG. 4, a system/method 300 for schematic conversion from a first technology to a second technology including hard-to-scale components is illustratively shown. In block 302, a hierarchy listing is provided for the components in the schematic to be converted to the new technology. In block 304, each hierarchy is traversed and the cells in the hierarchy are copied to a new library technology file (techfile). A technology file includes ground rules and layer information for the technology being used. Also, provided as part of the technology file are design rule checks and scaling rules.

In block 306, the appropriate scale factor is applied to the easily scaled pitch-matched circuits, and when appropriate such circuits and components are directly scaled to the new technology. For example, the circuits that match the pitch size in the y direction and/or the x direction are placed in the new layout with the new pitch. This may be performed using a MASH system or by programming skill code to execute the transition from one technology to another. In one illustration, a scale factor of, e.g., 1 may be applied to the y-pitch elements (elements influenced more by the y-pitch or minimum feature size of the layout), and a scale factor of 2 applied to the x-pitch elements (elements influenced more by the x-pitch or migration rules of the layout). The pitch-matched circuits are those that are easily scaled to the new technology.

In block 308, multiple scale factors are employed to convert leaf level cells (the smallest sized cells which may be included in array and ABIST™ common libraries) to the new dimensions in the new design regime. Elemental cells are converted to the new technology using a scale factor that permits the cells to fit within the layout of the area of the next highest level in the hierarchy. This will impact the scale factor to permit the cells to fit. Some of the cells and some of the components will not scale appropriately. These scale factors need to be adjusted. This can be performed by the black boxing technique described herein or by appropriately programmed code.

In block 310, the cells or components that are hard-to-scale or are more influenced by x-pitch (herein after a first set) are designated and placed in a black box to prevent these components from being scaled in the next step. All cells outside of the first set are then scaled, using in a top level macro, to the new technology in block 314. This scaling may include y-pitch influenced circuits, such as word decoders, drivers, latches, etc. Next, in block 316, the black box is removed from the hard-to-scale and x-pitch influenced circuits. Now the already scaled circuits are black boxed in block 318. The hard-to-scale and x-pitch influenced circuits are now scaled to the new technology in block 320, using a designed scaling of the hard-to-scale features by referencing the new techfile. For example, an SRAM cell may be referenced in the new techfile to determine the new scaling factors for the new technology. The hard-to-scale components are then scaled in accordance with the referenced or designed scaling stored in a library.

In block 324, parameterized cells or p-cells in the schematic reference a component description format (CDF) for the scaling of the p-cells. The CDF would be part of the new techfile and may be provided in the new library. In this way, p-cells are handled to permit the conversion from a schematic in the old technology regime to the new technology regime.

In block 326, the new schematic is further adjusted to fix device fingers, widths, beta ratios, unscaled pitches, etc. This may be performed manually by checking the design or by adjusting the skill code that defines the layout. In block 328, a layout versus schematic (LVS) is performed to determine wire widths that need may need to be adjusted with reference to a physical design (PD). Blocks 326 and 328 may be performed manually.

In block 330, timing and functionality checks are performed to determine if the new layout meets the requirements for timing and function. If not the process returns to block 326, otherwise the process ends. The process 300 may be repeated as needed. This may include rerunning these steps or some of these steps after different tools have been used to ensure design rule violations have been removed. It should be noted that the black-boxing is optional and are preferably employed when manual (user performed) scaling is provided.

It should be understood that FIGS. 3 and 4 also depict a system for scaling in accordance with the present principles. Systems 200 and 300 may be included in a circuit design drafting or analysis package. In one embodiment, a MASH tool may be modified to include the scaling capabilities of system 200 and 300. It is to be further understood that systems 200 and 300 may be integrated in a same device or system.

Figure 5:
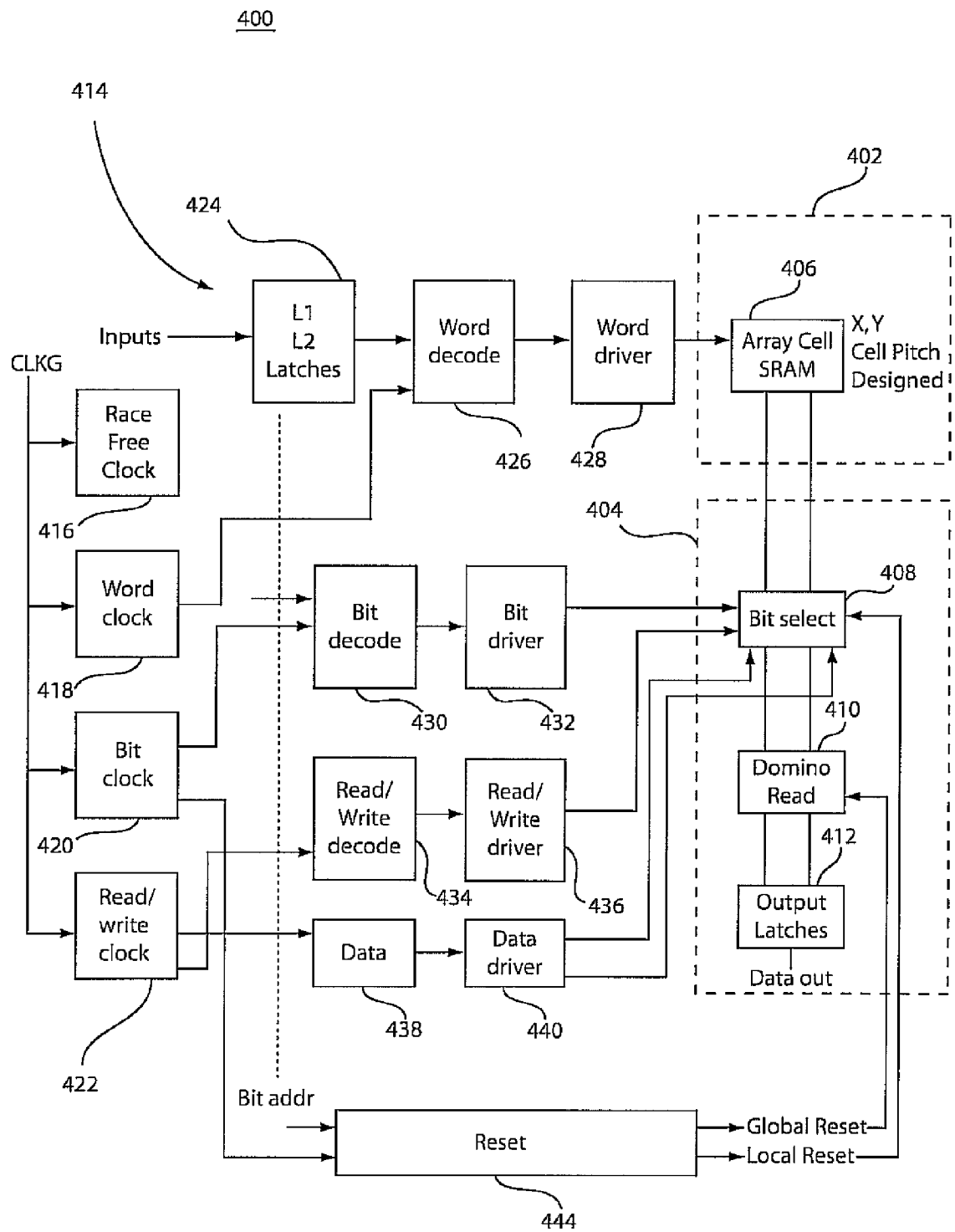
FIG. 5 is schematic diagram showing the scaling of a schematic design to a new technology by black boxing an SRAM cell and x-pitch circuits in accordance with the present principles.

Referring to FIG. 5, a schematic diagram for an SRAM circuit 400 is illustratively depicted to demonstrate the present principles. An array cell SRAM 406 is a hard-to-scale component. As depicted in FIG. 5, SRAM cell 406 is "black-boxed", which means that in a computer based tool such as a modified MASH tool, the circuit has been designated with a different scaling factor than other circuits 404 and 414. In this example, circuits 414 include components influenced by the y-pitch or the minimum feature size of the new technology that circuit 400 will be scaled to. In addition, circuits 404 are black-boxed to permit the scaling of circuits 414. In one embodiment, multiple black boxes can be employed. In addition, all black boxing steps may be implemented in a single code or program so that in one step multi-scale factors can be applied concurrently to the design.

As described above, the circuits or components that are more influenced by the y-pitch may include clock circuits, such as a race free clock 416, a word clock 418, a bit clock 420, and a read/write clock 422. Other components included in the y-pitch influenced circuits 414 include: Level 1 (L1) and level 2 (L2) latches 424, word decoder 426, word driver 428, bit decoder 430, bit driver 432, read/write decoder 434, read/write driver 436, data input 438, data driver 440 and a reset circuit 444.

After the y-pitch resealing to the new technology of circuit 414, the black boxes 402 and 404 are removed from the SRAM cell 406 and the circuits 408, 410 and 412, which are influenced more by migration rules (x-pitch influenced circuits).

Figure 6:
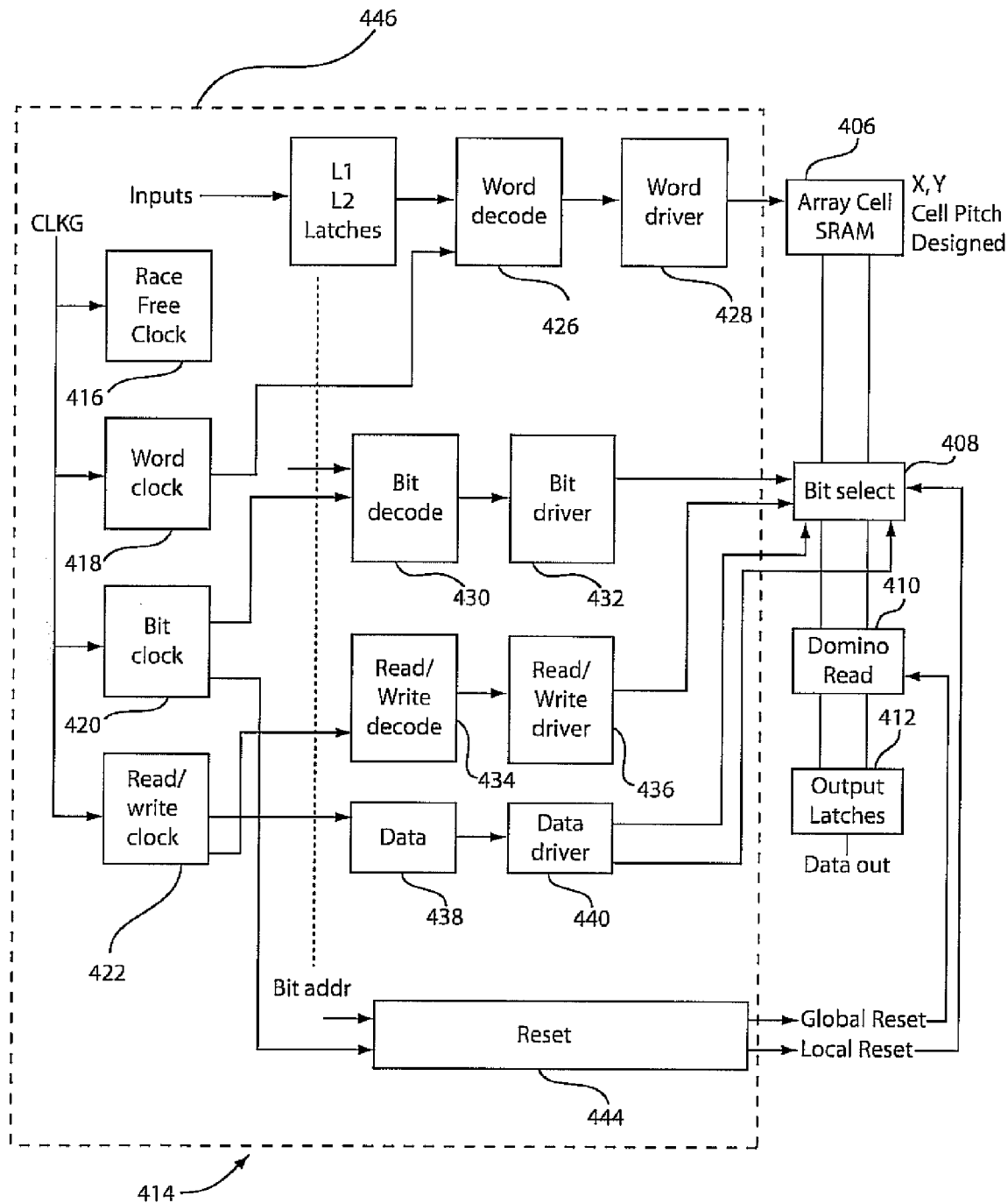
FIG. 6 is schematic diagram showing the scaling of the schematic design of FIG. 5 by black boxing other components to scale the SRAM cell and the x-pitch circuits in accordance with the present principles.

Referring to FIG. 6, a black box 446 is placed on circuits 414 to prevent further scaling of these circuits. Now, the x-pitched influenced circuits, e.g., a bit select circuit 408, a dominion read circuit 410 and output latches 412, are scaled in accordance with a new techfile stored in a library. The SRAM cell 406 includes a designed x and y pitch and once converted to the new technology permits the scaling of the other circuits (408, 410, 412) influenced by this pitch. In this way, the local areas of a layout can be customized to permit full conversion to new technologies despite the presence of hard-to-scale components. Using these methods, any memory designs can be converted from one technology to another.

In another embodiment, a similar conversion process may be applied more than once to reduce the "DRC" errors further. In other words, the method may be repeated to further determine/reduce design rule violations for different layers in a design.

The embodiments described herein can be combined with other CAD tools which generate design rule compliance (DRC) violations. For example, a tool that provides contact connections to transistors or creates interconnects. Violations caused by applying these other tools can be reduced by the present techniques. After the poly grid is checked in accordance with the present principles, contact layers and metal layers may be subsequently checked to ensure design rule compliance. E.g., the contact metal can be placed on the grid (in addition to poly silicon) which may force additional adjustments, which can result in design rule violations. Such a DRC feature may be necessary for sub-65 nm technologies.

Some of the advantages of the present principles include productivity enhancement for the key technology remaps, such as the complex conversion of an SRAM cell. Device/gate shapes can easily be enlarged or reduced, and ground rule violations are minimized since multiple design rule checks can be performed. In addition, timing and functionality specifications are also checked and met.

Having described preferred embodiments of a system and method for circuit design scaling (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A method for scaling a circuit design to a new technology, comprising:
    designating a first set of components including design scaled elements stored in a computer storage medium having a designed scaling in two dimensions to render the first set of components inactive for scaling of a second set of components stored in a computer storage medium, the second set of components, including pitch-matched circuits;
    scaling the second set of components;
    designating the second set of components to render the second set of components inactive for scaling of the first set of components;
    scaling the first set of components in accordance with a plurality of scale factors including:
        scaling the design scaled elements in accordance with reference scale factors; and
        scaling other components in the first set of components in accordance with one of the reference scale factors.

2. The method as recited in claim 1, wherein the second set of components includes components based on y-pitch.

3. The method as recited in claim 2, wherein the step of scaling the second set of components includes converting the second set of components to a y-pitch of the new technology.

4. The method as recited in claim 1, wherein the first set of components includes components based on x-pitch.

5. The method as recited in claim 1, wherein scaling the design scaled elements in accordance with reference scale factors includes scaling components based on x-pitch and y-pitch.

6. The method as recited in claim 5, wherein scaling other components in the first set of components in accordance with one of the reference scale factors includes scaling the other components based upon one of the x-pitch and the y-pitch of the design scaled elements.

7. The method as recited in claim 1, wherein designating a first set of components includes boxing the first set of components.

8. The method as recited in claim 1, wherein designating the second set of components includes boxing the second set of components.

9. The method as recited in claim 1, further comprising design rule checking, layout versus schematic checking and timing/functionality checking the circuit design in the new technology.

10. The method as recited in claim 1, further comprising manually fixing features in the circuit design.

11. The method as recited in claim 10, wherein manually fixing features in the circuit design includes fixing device fingers, widths, and unsealed pitches.

12. The method as recited in claim 1, wherein the circuit design is converted in a schematic form and the method further comprising scaling parameterized cells in accordance with a component description.

13. A computer program product for scaling a circuit design to a new technology comprising a computer useable medium including a computer readable program, wherein the computer readable program when executed on a computer causes the computer to perform the steps of:
    designating a first set of components including design scaled elements having a designed scaling in two dimensions to render the first set of components inactive for scaling of a second set of components, the second set of components, including pitch-matched circuits;
    scaling the second set of components;
    designating the second set of components to render the second set of components inactive for scaling of the first set of components;
    scaling the first set of components in accordance with a plurality of scale factors including:
        scaling the design scaled elements in accordance with reference scale factors; and
        scaling other components in the first set of components in accordance with one of the reference scale factors.

14. The computer program product as recited in claim 13, wherein the second set of components includes components based on y-pitch.

15. The computer program product as recited in claim 14, wherein the step of scaling the second set of components includes converting the second set of components to a y-pitch of the new technology.

16. The computer program product as recited in claim 13, wherein the first set of components includes components based on x-pitch.

17. The computer program product as recited in claim 13, wherein scaling the design scaled elements in accordance with reference scale factors includes scaling components based on x-pitch and y-pitch.

18. The computer program product as recited in claim 17, wherein scaling other components in the first set of components in accordance with one of the reference scale factors includes scaling the other components based upon one of the x-pitch and the y-pitch of the design scaled elements.

19. The computer program product as recited in claim 13, wherein designating a first set of components includes boxing the first set of components.

20. The computer program product as recited in claim 13, wherein designating the second set of components includes boxing the second set of components.

21. The computer program product as recited in claim 13, further comprising design rule checking, layout versus schematic checking and timing/functionality checking the circuit design in the new technology.

22. The computer program product as recited in claim 13, further comprising manually fixing features in the circuit design.

23. The computer program product as recited in claim 22, wherein manually fixing features in the circuit design includes fixing device fingers, widths, and unsealed pitches.

24. The computer program product as recited in claim 13, wherein the circuit design is converted in a schematic form and the method further comprising scaling parameterized cells in accordance with a component description.

25. A method for converting between technologies, comprising:
    copying cells of a design into a new library stored in a computer storage medium for a new technology;
    providing scale factors for pitch-matched circuits;
    using multiple scale factors, converting leaf level cells of the design into the new technology based upon the new library stored in the computer storage medium;
    black boxing a memory cell and already converted leaf level cells to scale other cells;
    scaling the memory cell in accordance with the new library stored in the computer storage medium; and
    updating other features of the design.

26. The method as recited in claim 25, wherein black boxing the memory cell includes fixing the memory cell while scaling other portions of the circuit.

27. The method as recited in claim 25, wherein updating other features of the design includes performing design rule checking, layout versus schematic checking and timing/functionality checking the circuit design in the new technology.

28. The method as recited in claim 25, updating other features of the design includes manually fixing features in the circuit design.

29. The method as recited in claim 28, wherein manually fixing features in the circuit design includes fixing device fingers, widths, and unscaled pitches.

30. The method as recited in claim 25, wherein the circuit design is converted in a schematic form and the method further comprising scaling parameterized cells in accordance with a component description.

31. A computer program product for converting between technologies comprising a computer useable medium including a computer readable program, wherein the computer readable program when executed on a computer causes the computer to perform the steps of:

copying cells of a design into a new library for a new technology;

providing scale factors for pitch-matched circuits;

using multiple scale factors, converting leaf level cells of the design into the new technology based upon the new library;

black boxing a memory cell and already converted leaf level cells to scale other cells;

scaling the memory cell in accordance with the new library; and updating other features of the design.

32. The computer program product as recited in claim 31, wherein black boxing the memory cell includes fixing the memory cell while scaling other portions of the circuit.

33. The computer program product as recited in claim 31, wherein updating other features of the design includes performing design rule checking, layout versus schematic checking and timing/functionality checking the circuit design in the new technology.

34. The computer program product as recited in claim 31, wherein updating other features of the design includes manually fixing features in the circuit design including fixing device fingers, widths, and unscaled pitches.

35. The method as recited in claim 31, wherein the circuit design is converted in a schematic form and the method further comprising scaling parameterized cells in accordance with a component description.

* * * * *